United States Patent
Yano et al.

(10) Patent No.: US 11,051,418 B2
(45) Date of Patent: *Jun. 29, 2021

(54) VEHICLE CONTROL DEVICE

(71) Applicant: Mitsubishi Electric Corporation, Tokyo (JP)

(72) Inventors: Kentaro Yano, Tokyo (JP); Morito Oh, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 24 days.

This patent is subject to a terminal disclaimer.

(21) Appl. No.: 16/487,168

(22) PCT Filed: Mar. 23, 2017

(86) PCT No.: PCT/JP2017/011760
§ 371 (c)(1),
(2) Date: Aug. 20, 2019

(87) PCT Pub. No.: WO2018/173202
PCT Pub. Date: Sep. 27, 2018

(65) Prior Publication Data
US 2020/0060038 A1    Feb. 20, 2020

(51) Int. Cl.
*H05K 5/06* (2006.01)
*B61K 13/00* (2006.01)
*H05K 5/03* (2006.01)

(52) U.S. Cl.
CPC ............ *H05K 5/069* (2013.01); *B61K 13/00* (2013.01); *H05K 5/03* (2013.01)

(58) Field of Classification Search
None
See application file for complete search history.

(56) References Cited

U.S. PATENT DOCUMENTS 6,861,589 B2 * 3/2005 Katsumata ........... H02G 3/0487
174/68.3
7,743,559 B2 * 6/2010 Papi ...................... B60J 5/0416
49/502

(Continued)

FOREIGN PATENT DOCUMENTS

JP    H022565 U    1/1990
JP    H03109383 U  11/1991

(Continued)

OTHER PUBLICATIONS

International Search Report (PCT/ISA/210) dated Jun. 20, 2017, by the Japan Patent Office as the International Searching Authority for International Application No. PCT/JP2017/011760.

*Primary Examiner* — Xanthia C Cunningham
(74) *Attorney, Agent, or Firm* — Buchanan Ingersoll & Rooney PC

(57) ABSTRACT

Fixing holes are formed around an opening of a housing. Holding members are each inserted into a corresponding fixing hole and are fixed to the housing by swaging. Two or more holding members are each provided with a corresponding protrusion member. Fitting holes and first insertion holes are formed around a central opening of a packing and the protrusion members are each fitted into a corresponding fitting holes. The packing is attached to the housing by fitting each of the protrusion members into the corresponding fitting hole. Fastening members are each inserted through a corresponding first insertion hole and a corresponding second insertion hole formed in a cover and are inserted into and fixed to holding members other than the above-described two or more holding members, so that the cover is attached to the housing.

12 Claims, 12 Drawing Sheets

(56) References Cited

U.S. PATENT DOCUMENTS

| 8,926,246 B2 * | 1/2015 | I | B60R 16/0238 |
| | | | 411/166 |
| 2016/0197462 A1 * | 7/2016 | Hamada | H02G 3/088 |
| | | | 174/50 |
| 2016/0270270 A1 * | 9/2016 | Madsen | H04B 1/082 |

FOREIGN PATENT DOCUMENTS

| JP | H0543430 U | 6/1993 |
| JP | 2003031966 A | 1/2003 |
| JP | 2004087739 A | 3/2004 |
| JP | 2016111835 A | 6/2016 |
| JP | 2016127102 A | 7/2016 |

\* cited by examiner

FIG.1
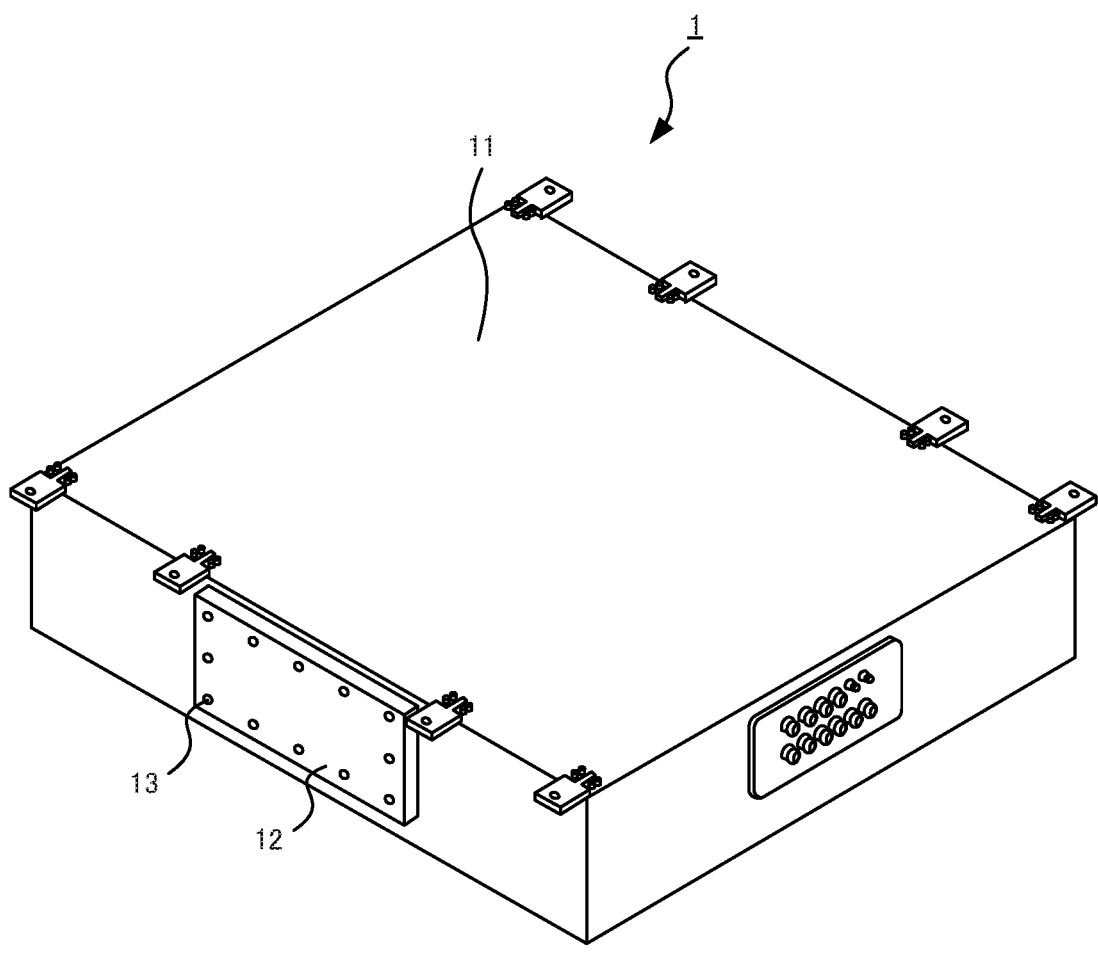
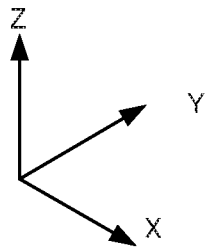

FIG.2
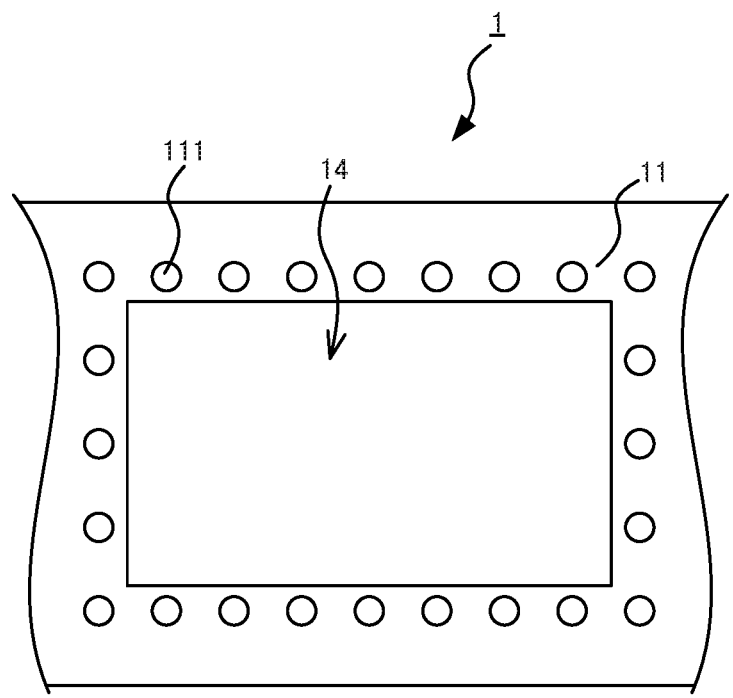
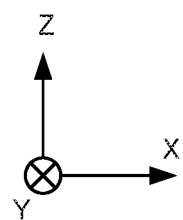

FIG.4
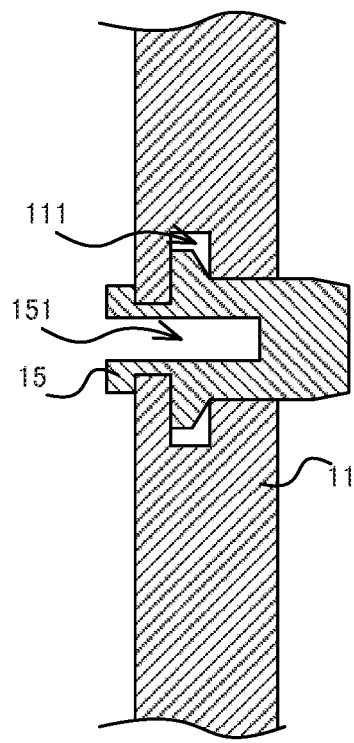
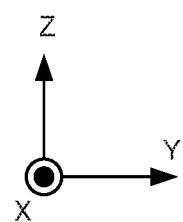

FIG.6
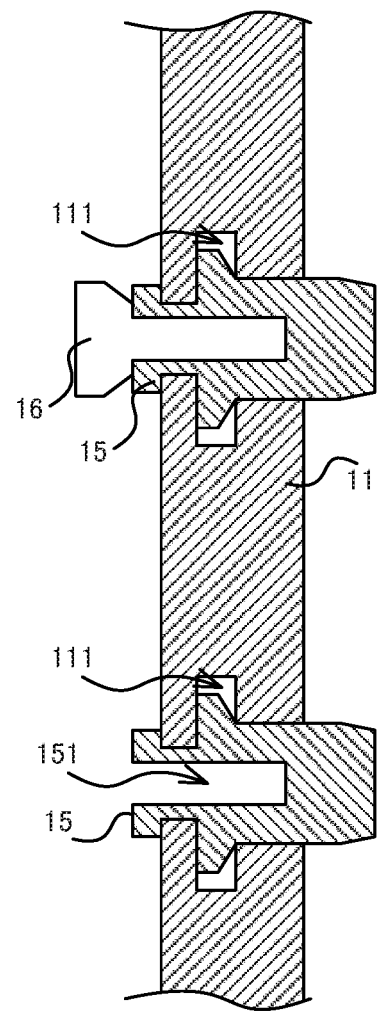
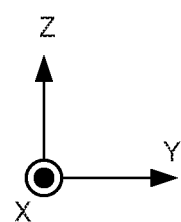

FIG.12
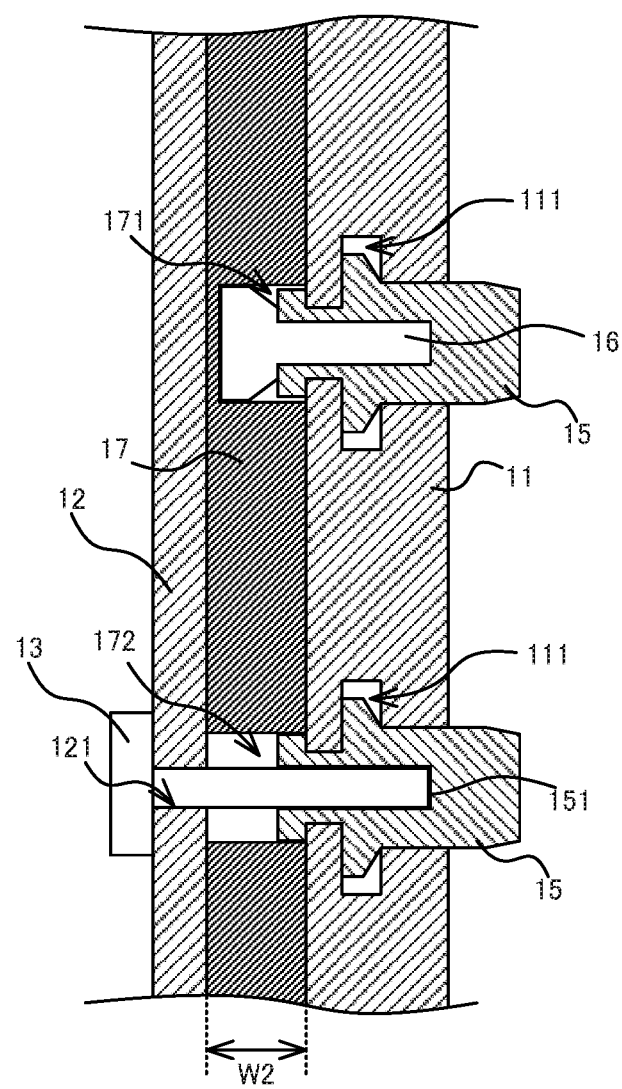
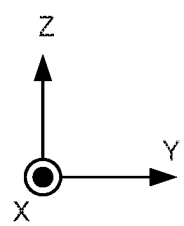

VEHICLE CONTROL DEVICE

TECHNICAL FIELD

The present disclosure relates to a vehicle control device in which an opening is provided with a packing and a cover.

BACKGROUND ART

An opening is formed in a housing of a vehicle control device mounted on a railroad vehicle for performance of periodic maintenance of electronic components in the control device. In order to prevent water, dust and the like from penetrating into the housing, a cover is attached to cover the opening. Also, in order to improve waterproofness and dustproofness, a packing is disposed between the opening and the cover.

Patent Literature 1 discloses a waterproof packing that is disposed between a housing body and a door and that is fastened between the housing body and the door by bolts and nuts.

CITATION LIST

Patent Literature

Patent Literature 1: Unexamined Japanese Patent Application Kokai Publication No. 2003-31966

SUMMARY OF INVENTION

Technical Problem

The electronic components inside the vehicle control device mounted on the railroad vehicle are periodically maintained. Also, in order to keep the dustproofness and waterproofness of the packing disposed between the opening of the vehicle control device and the cover, replacement of the packing at regular intervals is required. The waterproof packing disclosed in Patent Literature 1 is disposed between the door and the housing body. The waterproof packing is fastened by the bolts and the nuts at regular intervals. Accordingly, when the packing is removed, all of the bolts and all of the nuts must be removed. Accordingly, in a case in which the waterproof packing disclosed in Patent Literature 1 is disposed at the opening of the vehicle control device, the larger the opening, the more complicated maintenance work of the vehicle control device becomes. In order to facilitate replacement of the packing, for example, fixing by bolts and nuts at only four corners of the packing is permissible. In this case, the larger the opening, the larger distances between the bolts become, so that the packing sags under the weight of the packing, which may cause a deterioration of sealing performance of the packing.

In order to solve the aforementioned problem, an objective of the present disclosure is to improve the maintainability of the vehicle control device while maintaining the sealing performance of the packing.

Solution to Problem

In order to achieve the aforementioned objective, a vehicle control device of the present disclosure includes a housing configured to be mounted on a vehicle, holding members, protrusion members, a packing, a cover, and fastening members. An opening is formed in the housing and fixing holes that extend from the exterior of the housing toward the interior of the housing are formed in a periphery of the opening. Each of the holding members is inserted into a corresponding fixing hole of the fixing holes and is fixed to the housing by swaging. Each of the holding members has a fastening hole that extends from the exterior of the housing toward the interior of the housing. The protrusion members are each disposed at one of two or more of the holding members among the holding members with each protrusion member inserted into a corresponding fastening hole of the holding member, and the protrusion members each has one end protruding outward from the housing in a state in which the protrusion members are each fixed to the corresponding holding member of the two or more holding members. A central opening that is a through hole is formed in the packing. The packing has, in a periphery of the central opening, (i) fitting holes into which the protrusion members are fitted and (ii) first insertion holes that are through holes and that each face a corresponding holding member of holding members other than the two or more holding members. The packing is attached to the housing by fitting the protrusion members into the fitting holes, thereby covering the periphery of the opening. Second insertion holes that are through holes and that each face a corresponding first insertion hole of the first insertion holes are formed in the cover. The cover covers the opening and the periphery of the opening with the packing between the cover and the housing. The fastening members are each inserted through the corresponding first insertion hole and the corresponding second insertion hole that faces the corresponding first insertion hole, inserted into the fastening hole of the corresponding holding member that faces the corresponding first insertion holes, and then fixed to the corresponding holding member, so that the cover is attached to the housing.

Advantageous Effects of Invention

According to the present disclosure, two or more holding members of the holding members fixed to the housing by swaging are each disposed at a corresponding protrusion member of the protrusion members, the packing is attached to the housing by fitting each of the protrusion members into a corresponding fitting hole of the fitting holes formed in the packing, and then the cover is attached to the housing by the fastening members that are inserted through the first insertion holes formed in the packing and through the second insertion holes formed in the cover and then inserted into the fastening holes of the holding members other than the above-described two or more holding members. As a result, the maintainability of the vehicle control device can be improved while maintaining the sealing performance of the vehicle control device.

BRIEF DESCRIPTION OF DRAWINGS

FIG. 1 is a perspective view of a vehicle control device according to an embodiment of the present disclosure;

FIG. 2 is a front view of the vehicle control device according to the embodiment;

FIG. 4 is a partial cross-sectional view of the vehicle control device according to the embodiment;

FIG. 6 is a partial cross-sectional view of the vehicle control device according to the embodiment;

FIG. 12 is a partial cross-sectional view of the vehicle control device according to the embodiment.

Figure 3:
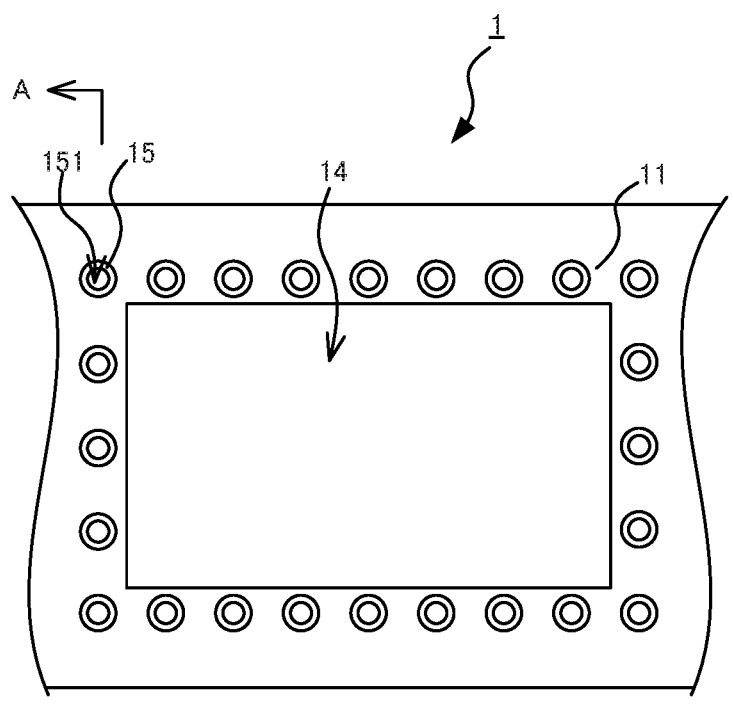
FIG. 3 is a front view of the vehicle control device according to the embodiment.

An embodiment of the present disclosure is described in detail hereinafter with reference to the drawings. Components that are the same or equivalent are assigned the same reference signs throughout the drawings.

FIG. 1 is a perspective view of a vehicle control device according to the embodiment of the present disclosure. In FIG. 1, the Z-axis corresponds to the vertical direction, the X-axis denotes a direction of movement of a vehicle on which a vehicle control device 1 is mounted, and the Y-axis denotes a width direction of the vehicle on which the vehicle control device 1 is mounted. The vehicle control device 1 is mounted on, for example, an electric railroad vehicle. A housing 11 of the vehicle control device 1 is mounted under a floor or on a roof of the vehicle. An orientation of the vehicle control device 1 mounted on the vehicle is not limited to the example illustrated in FIG. 1. FIG. 2 is a front view of the vehicle control device according to the embodiment. FIG. 2 is a view when the vehicle control device 1 is viewed in a positive direction of the Y axis. An opening 14 is formed in the housing 11 of the vehicle control device 1. The opening 14 is provided with a cover 12, and the cover 12 is fixed to the housing 11 by fastening members 13. Fixing holes 111 extending from an exterior toward an interior of the housing 11 are formed in a periphery of the opening 14 of the housing 11. Penetration by the fixing holes 111 is optional.

FIG. 3 is a front view of the vehicle control device according to the embodiment. FIG. 4 is a partial cross-sectional view of the vehicle control device according to the embodiment. FIG. 4 is a cross-sectional view taken along line A-A in FIG. 3. Holding members 15 are each inserted into a corresponding fixing hole of the fixing holes 111 and are fixed to the housing 11 by swaging. Each of the holding members 15 has a corresponding fastening holder of fastening holes 151 that extend from the exterior toward the interior of the housing 11. The holding members 15 are, for example, blind nuts.

Figure 5:
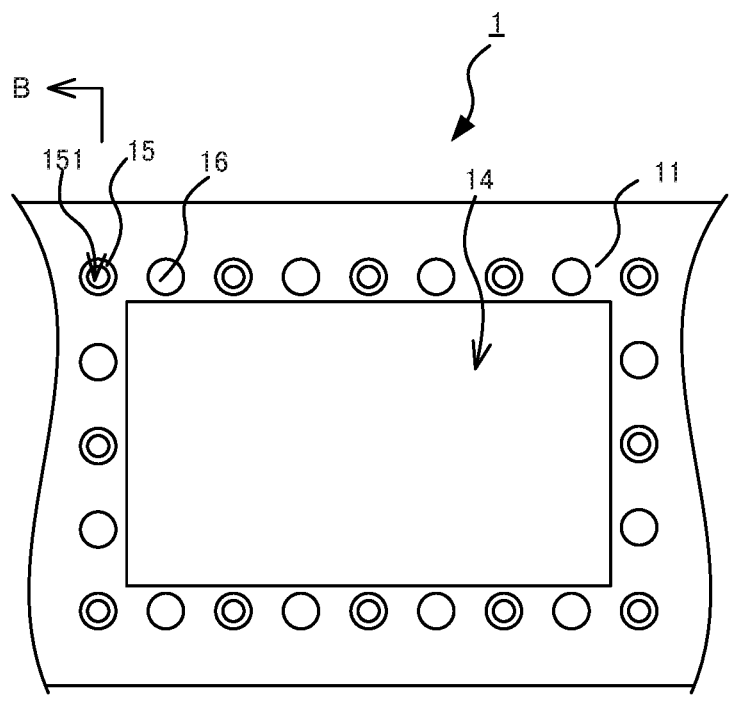
FIG. 5 is a front view of the vehicle control device according to the embodiment.

FIG. 5 is a front view of the vehicle control device according to the embodiment. FIG. 6 is a partial cross-sectional view of the vehicle control device according to the embodiment. FIG. 6 is a cross-sectional view taken along line B-B in FIG. 5. Two or more holding members 15 among the holding members 15 are each provided with a corresponding protrusion member of protrusion members 16. The protrusion members 16 are each inserted into a corresponding fastening hole of the fastening holes 151. The protrusion members 16 are each fixed to a corresponding holding member of the holding members 15, so that one end of each of the protrusion members 16 protrudes outward from the housing 11 in a state in which the protrusion members 16 are fixed to the holding members 15. The protrusion members 16 are, for example, flat head rivets, flat head screws, or the like. Faces of the ends of the protrusion members 16 protruding outward from the housing 11 are not limited to flat faces and may be curved faces. Distances between the fixing holes 111, the number of the protrusion members 16, and positions at which the protrusion members 16 are fastened are determined in accordance with a size of the opening 14, weight and material of a packing 17 described below, and required sealing performance of the vehicle control device 1.

Figure 7:
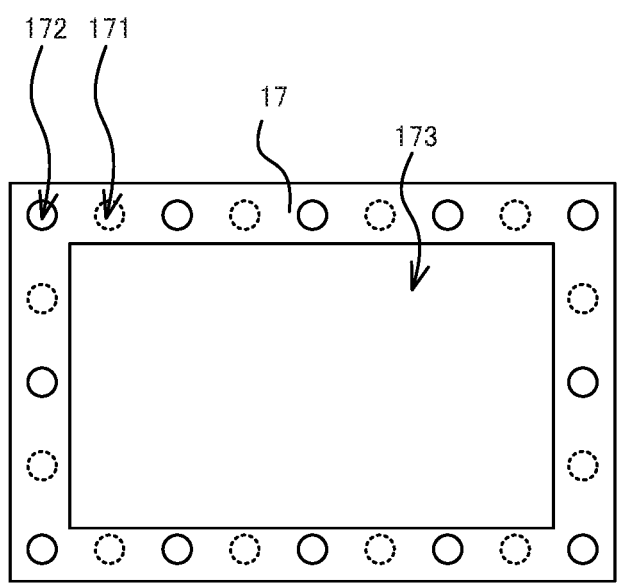
FIG. 7 is a front view of a packing according to the embodiment.
Figure 8:
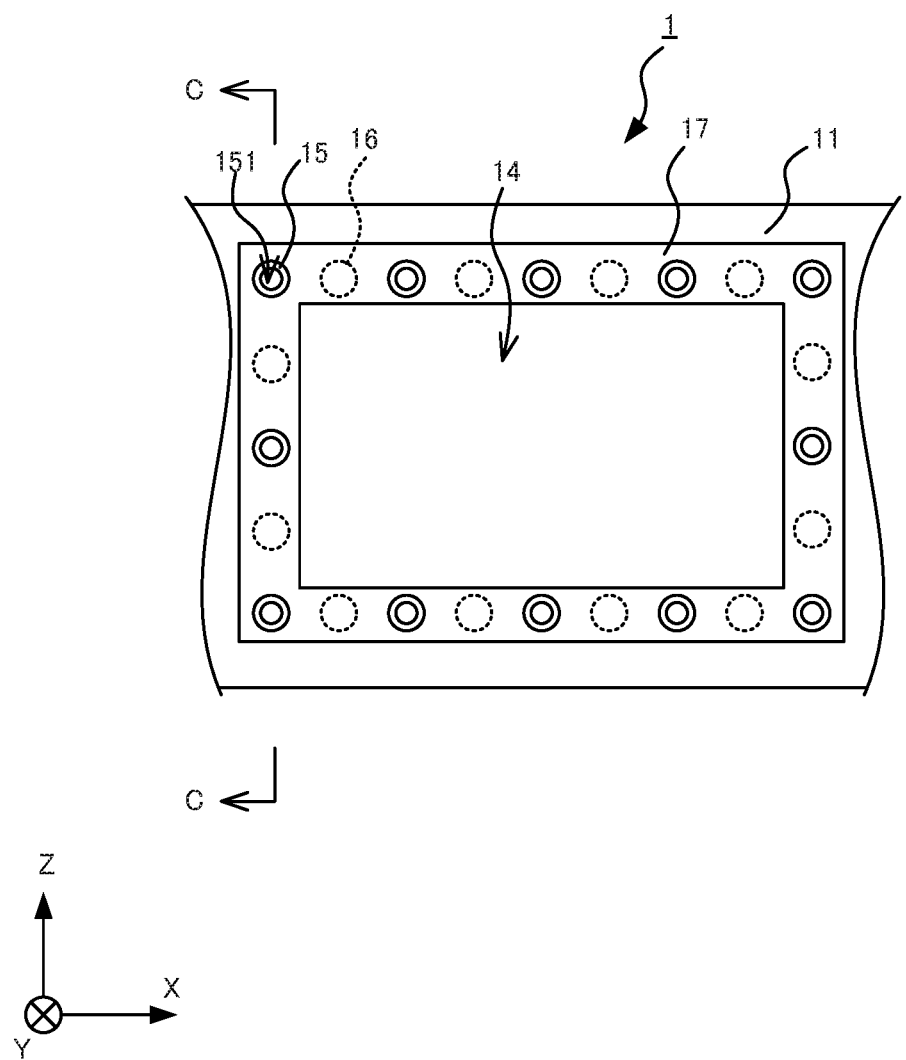
FIG. 8 is a front view of the vehicle control device according to the embodiment.
Figure 9:
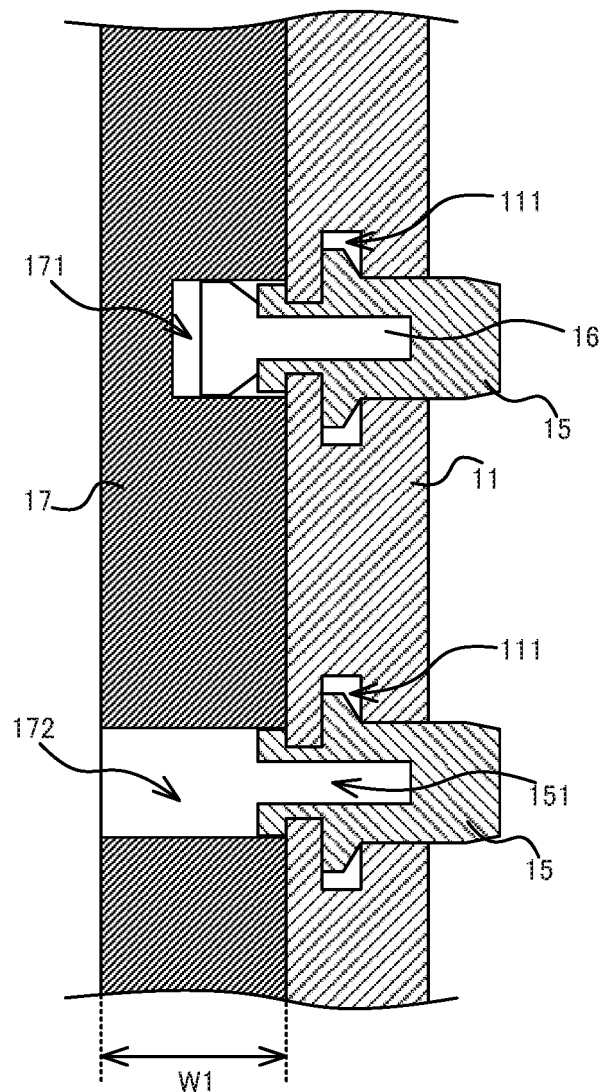
FIG. 9 is a partial cross-sectional view of the vehicle control device according to the embodiment.

FIG. 7 is a front view of a packing according to the embodiment. In order to improve waterproofness and dustproofness of the housing 11, the packing 17 is disposed at a periphery of the opening 14 with the packing 17 between the housing 11 and the cover 12. FIG. 8 is a front view of the vehicle control device according to the embodiment. FIG. 8 illustrates a state in which the packing 17 is attached to the housing 11. FIG. 9 is a partial cross-sectional view of the vehicle control device according to the embodiment. FIG. 9 is a cross-sectional view taken along line C-C in FIG. 8. A central opening 173 that is a through hole is formed in the packing 17. Fitting holes 171 into which the protrusion members 16 are fitted are formed in a periphery of the central opening 173. Also, first insertion holes 172 that are through holes are formed in the periphery of the central opening 173 such that the first insertion holes 172 each face a corresponding holding member of holding members 15 among the holding members 15 other than the above-described two or more holding members 15, that is, in an example illustrated in FIGS. 7 to 9, holding members 15 that are not provided with the protrusion members 16. In the example illustrated in FIGS. 7 to 9, the fitting holes 171 and the first insertion holes 172 are formed alternatingly in the periphery of the central opening 173. The packing 17 is attached to the housing 11 by fitting each of the protrusion members 16 into a corresponding fitting hole of the fitting holes 171. The packing 17 attached to the housing 11 covers the periphery of the opening 14 of the housing 11. Although the fitting holes 171 are not through holes in the example illustrated in FIGS. 7 to 9, the fitting holes 171 may be through holes.

The packing 17 is made with a material that contracts in a pressing direction when the packing 17 is pressed. In a state in which the packing 17 is attached to the housing 11 and the cover 12 is not attached to the housing 11, a width W1 of the packing 17 in a penetration direction of the central opening 173, that is, in the Y-axis direction, is larger than lengths of portions of the protrusion members 16 protruding outward from the housing 11.

Figure 10:
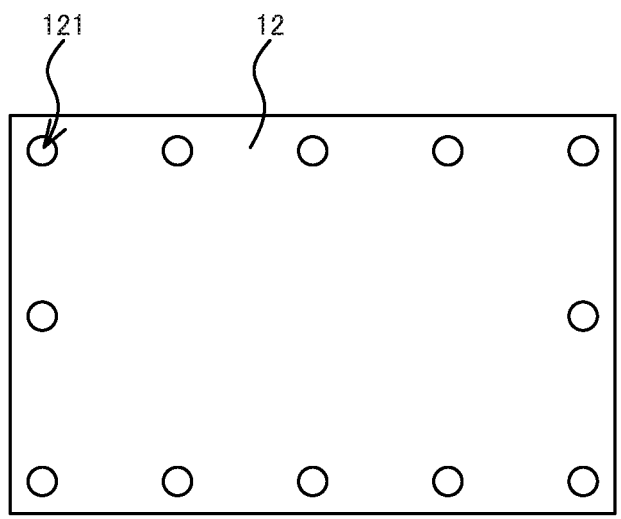
FIG. 10 is a front view of a cover according to the embodiment.
Figure 11:
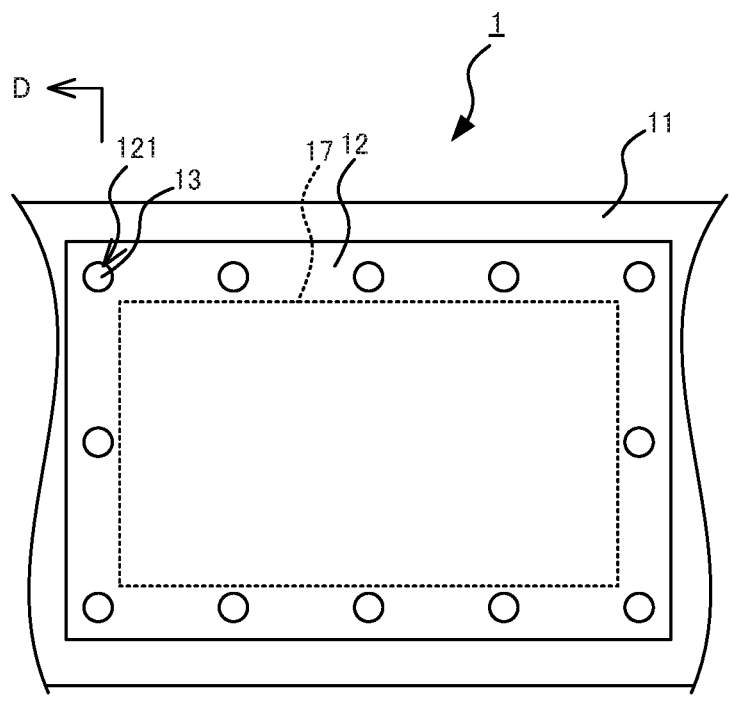
FIG. 11 is a front view of the vehicle control device according to the embodiment.

FIG. 10 is a front view of a cover according to the embodiment. FIG. 11 is a front view of the vehicle control device according to the embodiment. FIG. 11 illustrates a state in which the packing 17 and the cover 12 are attached to the housing 11. FIG. 12 is a partial cross-sectional view of the vehicle control device according to the embodiment. FIG. 12 is a cross-sectional view taken along line D-D in FIG. 11. Second insertion holes 121 that are through holes are formed in the cover 12 and each face one of the first insertion holes 172. In an example illustrated in FIGS. 10 to 12, second insertion holes 121 are formed in the cover 12. The cover 12 covers the opening 14 and the periphery of the opening 14 with the packing 17 between the cover 12 and the housing 11. The fastening members 13 are each inserted through the corresponding first insertion hole of the first insertion holes 172 and the corresponding second insertion hole of the second insertion holes 121, are inserted into the fastening holes 151 of the holding members 15 that face the first insertion holes 172, and then are fixed to the holding members 15, so that the cover 12 is attached to the housing 11.

In a state in which the cover 12 is attached to the housing 11, a width W2 of the packing 17 in the Y-axis direction is smaller than the width W1 and equal to or larger than the lengths of the protrusion members 16 protruding outward from the housing 11. In the state in which the cover 12 is attached to the housing 11, a compression ratio of the packing 17 in the Y-axis direction is within a specific range. The specific range is determined in accordance with the required sealing performance of the packing 17.

In the above-described example, the holding members 15 to which the protrusion members 16 are fastened and the holding members 15 to which the fastening members 13 are fastened are arranged alternately. Such alternating arrangement of the holding members 15 to which the protrusion members 16 are fastened and the holding members 15 to which the fastening members 13 are fastened creates uniformity, which can improve the beauty of the vehicle control device. Sizes of cross sections of the holding members 15 to which the protrusion members 16 are fixed may be equal to or different from sizes of cross sections of the holding members 15 to which the fastening members 13 are fastened.

As described above, the packing 17 is attached to the housing 11 by fitting each of the protrusion members 16 into the corresponding fitting hole of the fitting holes 171. The fastening members 13 are each inserted through the corresponding first insertion hole 172 and the corresponding second insertion hole 121 and then are inserted into and fastened to the fastening hole 151 of the corresponding holding member 15, so that the cover 12 is attached to the housing 11. Such a structure enables maintenance of electronic components inside the vehicle control device 1 with the packing 17 remaining attached to the housing 11. Since there is no need to remove the packing 17 during each maintenance of the electronic components inside the vehicle control device 1, deterioration of the packing 17 due to repeated attachment and removal of the packing 17 can be suppressed. Accordingly, the sealing performance of the vehicle control device 1 can be maintained. Also, since the work for attachment of the cover 12 can be performed with the packing 17 attached to the housing 11, workability of attachment of the cover 12 improves.

The packing 17 is attached to the housing 11 by the protrusion members 16. The number of the protrusion members 16 and positions at which the protrusion members 16 are attached, and the like are adjusted in accordance with the size of the opening 14, weight and material of the packing 17, and the required sealing performance of the vehicle control device 1, thereby inhibiting the packing 17 from sagging under the weight of the packing 17. Accordingly, the sealing performance of the packing 17 is maintained and thus the sealing performance of the vehicle control device 1 is maintained. Even if the number of the protrusion members 16 is increased in order to maintain the sealing performance of the packing 17, the increase in the number of the protrusion members 16 has no influence on the work for attachment and removal of the fastening member 13. That is, even if the number of the protrusion members 16 is increased in order to maintain the sealing performance of the vehicle control device 1, the increase in the number of the protrusion members 16 does not cause maintenance work of the vehicle control device 1 to become complicated. The fastening members 13 are each inserted into the corresponding holding member of the holding members 15 in the vehicle control device 1, so that maintenance work on the vehicle control device 1 according to the embodiment is easier than maintenance work in a case in which a waterproof packing is fastened by bolts and nuts at a constant pitch.

Since the packing 17 can be attached to the housing 11 by the protrusion members 16 that are each fixed to the corresponding holding member of the holding members 15 fixed to the housing 11 by swaging, there is no need to perform, on the cover 12, processing such as welding or cutting in order to attach the packing 17. Accordingly, a thin plate made of aluminum, stainless steel, or the like may be used as the cover 12, The use of the thin plate made of aluminum, stainless steel, or the like enables a reduction in weight of the cover 12, thereby improving maintainability of the vehicle control device 1. Also, since the holding members 15 are fixed to the housing 11 by swaging, there is no need to perform, for example, metal plate processing such as extrusion and cutting, and welding processing of the housing 11, thereby reducing complication of the manufacturing process.

In a state in which the packing 17 is not attached to the housing 11, a cross section of each of the fitting holes 171 perpendicular to a direction in which the fitting holes 171 extend is smaller than a cross section of one end of the corresponding protrusion member of the protrusion members 16 perpendicular to a direction in which the protrusion members 16 protrude, where the one end of the corresponding protrusion member of the protrusion members 16 protrudes outward from the housing 11. Also, in the state in which the packing 17 is not attached to the housing 11, a cross section of each of the first insertion holes 172 perpendicular to a direction in which the first insertion holes 172 extend is smaller than a cross section of a portion of the corresponding holding member of the holding members 15 protruding outward from the housing 11, where the cross-section of the portion of the corresponding holding member of the holding members 15 is perpendicular to a direction in which the fastening holes 151 extend. Upon attaching the packing 17 to the housing 11, the packing 17 is pressed, thereby enlarging the fitting holes 171 and the first insertion holes 172. As a result of deformation of the packing 17 due to pressing of the packing 17, in the state in which the packing 17 is attached to the housing 11, inner circumferential surfaces of the fitting holes 171 come into contact with outer circumferential surfaces of the protrusion members 16, and the inner circumferential surfaces of the first insertion holes 172 come into contact with outer circumferential surfaces of ends of the holding members 15 protruding outward from the housing 11. In the state in which the packing 17 is not attached to the housing 11, the fitting holes 171 are formed to each have a cross section that is smaller than the cross sections of the protrusion members 16, and the first insertion holes 172 are formed to each have a cross section that is smaller than the cross sections of the one ends of the holding members 15, thereby enabling an improvement of the sealing performance of the packing 17. Accordingly, the sealing performance of the vehicle control device 1 can be improved.

As described above, according to the vehicle control device 1 of the present embodiment, among the holding members 15 fixed to the housing 11 by swaging, two or more holding members 15 are provided with the protrusion members 16, the packing 17 is attached to the housing 11 by fitting the protrusion members 16 into the fitting holes 171 formed in the packing 17, and the cover 12 is attached to the housing 11 by inserting the fastening members 13 through the first insertion holes 172 formed in the packing 17 and the second insertion holes 121 formed in the cover 12, and inserting the fastening members 13 into the fastening holes 151 of the holding members 15 other than the above-described two or more holding members 15. As a result, the maintainability of the vehicle control device 1 can be improved while maintaining the sealing performance of the vehicle control device 1.

If the packing 17 is fixed to the housing 1, for example, with an adhesive, the packing 17 cannot be easily replaced with another one, thereby making dustproofness and waterproofness of the housing 11 difficult to maintain. However, in the vehicle control device 1 according to the present embodiment, among the holding members 15 swaged to be fixed in a periphery of the opening 14 of the housing 11, two or more holding members 15 are provided with the protrusion members 16, and the packing 17 is attached to the housing 11 by fitting the protrusion members 16 into the fitting holes 171 formed in the packing 17. As a result, the packing 17 can be held by the housing 11 without fixing the packing 17 to the housing 11 using any adhesives and can be easily attached to or removed from the housing 11, so that maintainability of the packing 17 can be improved. The dustproofness and waterproofness of the housing 11 can be maintained by improving the maintainability of the packing 17.

The present disclosure is not limited to the above-described embodiment. The holding members 15 to which the protrusion members 16 are attached may be disposed on an inner circumference side nearer to the opening 14 and the holding members 15 fastened to the fastening members 13 may be disposed on an outer circumference area. Alternatively, the holding members 15 fastened to the fastening members 13 may be disposed on the inner circumference side nearer to the opening 14 and the holding members 15 fastened to the protrusion members 16 may be disposed on the outer circumference area. The central opening 173 may also serve as the fitting holes 171 and, for example, each of the protrusion members 16 may be fitted into the central opening 173. The fitting holes 171 and the first insertion holes 172 may each be slits.

Since the holding members 15 fastened to the protrusion members 16 are not used for fixing the cover 12, the cross sections of the holding members 15 fastened to the protrusion members 16 may be smaller than those of the holding members 15 to which the fastening members 13 are attached. As a result, the sealing performance of the vehicle control device 1 can be improved. Also, such a structure produces an effect of preventing the packing 17 from dropping off.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Vehicle control device
11 Housing
12 Cover
13 Fastening member
14 Opening
15 Holding member
16 Protrusion member
17 Packing
111 Fixing hole
121 Second insertion hole
151 Fastening hole
171 Fitting hole
172 First insertion hole
173 Central opening

The invention claimed is:

1. A vehicle control device comprising:
   a housing configured to be mounted on a vehicle, the housing having an opening and fixing holes formed in a periphery of the opening, the fixing holes extending from an exterior of the housing toward an interior of the housing;
   holding members each inserted into a corresponding fixing hole of the fixing holes and fixed to the housing by swaging, the holding members each having a fastening hole extending from the exterior of the housing toward the interior of the housing;
   protrusion members each disposed at one of two or more holding members among the holding members with each protrusion member inserted into a corresponding fastening hole of the holding member, the protrusion members each having one end protruding outward from the housing in a state in which the protruding members are each fixed to the corresponding holding member of the two or more holding members;
   a packing having
      a central opening that is a through hole,
      fitting holes into which the protrusion members are to be fitted, and
      first insertion holes that are through holes, the fitting holes and first insertion holes being formed in a periphery of the central opening, the first insertion holes each facing a corresponding holding member of holding members other than the two or more holding members, the packing being attachable to the housing with the protrusion members fitted into the fitting holes to cover the periphery of the opening;
   a cover having second insertion holes that are through holes and that each face a corresponding first insertion hole of the first insertion holes, the cover being configured to cover the opening and the periphery of the opening with the packing between the housing and the cover; and
   fastening members each configured to attach the cover to the housing by inserting each of the fastening members through the corresponding first insertion hole and the corresponding second insertion hole that faces the corresponding first insertion hole, inserting each of the fastening members into the fastening hole of the corresponding holding member that faces the corresponding first insertion hole, and fixing each of the fastening members to the corresponding holding member.

2. The vehicle control device according to claim 1, wherein
   the holding members to which the protrusion members are fixed and the holding members to which the fastening members are fixed are disposed alternately.

3. The vehicle control device according to claim 2, wherein
   the packing is made with a material that contracts in a pressing direction when the packing is pressed, in a state in which the packing is attached to the housing and the cover is not attached to the housing, a width of the packing in a penetration direction of the central opening is larger than a length of each of the protrusion members protruding outward from the housing, and in a state in which the cover is also attached to the housing, a compression ratio of the packing in the penetration direction of the central opening is within a specific range.

4. The vehicle control device according to claim 2, wherein the packing is made with a material that contracts in a pressing direction when the packing is pressed, in a state in which the packing is not attached to the housing, a cross section of each of the fitting holes perpendicular to a direction in which the fitting holes extend is smaller than a cross section of one end of a corresponding protrusion member of the protrusion members protruding outward from the housing, the cross sections of the one ends of the protrusion members being perpendicular to a direction in which the protrusion members protrude outward from the housing, and in the state in which the packing is attached to the housing, an inner circumferential surface of each of the fitting holes comes into contact with an outer circumferential surface of the corresponding protrusion member of the protrusion members.

5. The vehicle control device according to claim 3, wherein the packing is made with a material that contracts in a pressing direction when the packing is pressed, in a state in which the packing is not attached to the housing, a cross section of each of the fitting holes perpendicular to a direction in which the fitting holes extend is smaller than a cross section of one end of a corresponding protrusion member of the protrusion members protruding outward from the housing, the cross sections of the one ends of the protrusion members being perpendicular to a direction in which the protrusion members protrude outward from the housing, and in the state in which the packing is attached to the housing, an inner circumferential surface of each of the fitting holes comes into contact with an outer circumferential surface of the corresponding protrusion member of the protrusion members.

6. The vehicle control device according to claim 5, wherein a cross section of each of the first insertion holes perpendicular to a direction in which the first insertion holes extend is smaller than a cross section of a portion of a corresponding holding member of the holding members protruding outward from the housing, the cross section of the portion of the corresponding holding member of the holding members being perpendicular to a direction in which the fastening holes extend, and in the state in which the packing is attached to the housing, an inner circumferential surface of each of the first insertion holes comes into contact with an outer circumferential surface of the portion of a corresponding holding member of the holding members, the portion of the corresponding holding member protruding outward from the housing.

7. The vehicle control device according to claim 4, wherein a cross section of each of the first insertion holes perpendicular to a direction in which the first insertion holes extend is smaller than a cross section of a portion of a corresponding holding member of the holding members protruding outward from the housing, the cross section of the portion of the corresponding holding member of the holding members being perpendicular to a direction in which the fastening holes extend, and in the state in which the packing is attached to the housing, an inner circumferential surface of each of the first insertion holes comes into contact with an outer circumferential surface of the portion of a corresponding holding member of the holding members, the portion of the corresponding holding member protruding outward from the housing.

8. The vehicle control device according to claim 1, wherein the packing is made with a material that contracts in a pressing direction when the packing is pressed, in a state in which the packing is attached to the housing and the cover is not attached to the housing, a width of the packing in a penetration direction of the central opening is larger than a length of each of the protrusion members protruding outward from the housing, and in a state in which the cover is also attached to the housing, a compression ratio of the packing in the penetration direction of the central opening is within a specific range.

9. The vehicle control device according to claim 8, wherein the packing is made with a material that contracts in a pressing direction when the packing is pressed, in a state in which the packing is not attached to the housing, a cross section of each of the fitting holes perpendicular to a direction in which the fitting holes extend is smaller than a cross section of one end of a corresponding protrusion member of the protrusion members protruding outward from the housing, the cross sections of the one ends of the protrusion members being perpendicular to a direction in which the protrusion members protrude outward from the housing, and in the state in which the packing is attached to the housing, an inner circumferential surface of each of the fitting holes comes into contact with an outer circumferential surface of the corresponding protrusion member of the protrusion members.

10. The vehicle control device according to claim 9, wherein a cross section of each of the first insertion holes perpendicular to a direction in which the first insertion holes extend is smaller than a cross section of a portion of a corresponding holding member of the holding members protruding outward from the housing, the cross section of the portion of the corresponding holding member of the holding members being perpendicular to a direction in which the fastening holes extend, and in the state in which the packing is attached to the housing, an inner circumferential surface of each of the first insertion holes comes into contact with an outer circumferential surface of the portion of a corresponding holding member of the holding members, the portion of the corresponding holding member protruding outward from the housing.

11. The vehicle control device according to claim 1, wherein the packing is made with a material that contracts in a pressing direction when the packing is pressed, in a state in which the packing is not attached to the housing, a cross section of each of the fitting holes perpendicular to a direction in which the fitting holes extend is smaller than a cross section of one end of a corresponding protrusion member of the protrusion members protruding outward from the housing, the cross sections of the one ends of the protrusion members being perpendicular to a direction in which the protrusion members protrude outward from the housing, and in the state in which the packing is attached to the housing, an inner circumferential surface of each of the fitting holes comes into contact with an outer circumferential surface of the corresponding protrusion member of the protrusion members.

12. The vehicle control device according to claim 11, wherein a cross section of each of the first insertion holes perpendicular to a direction in which the first insertion holes extend is smaller than a cross section of a portion of a corresponding holding member of the holding members protruding outward from the housing, the cross section of the portion of the corresponding holding member of the holding members being perpendicular to a direction in which the fastening holes extend, and in the state in which the packing is attached to the housing, an inner circumferential surface of each of the first insertion holes comes into contact with an outer circumferential surface of the portion of a corresponding holding member of the holding members, the portion of the corresponding holding member protruding outward from the housing.

* * * * *